(12) United States Patent
Lou et al.

(10) Patent No.: US 11,296,439 B2
(45) Date of Patent: Apr. 5, 2022

(54) ELECTRICAL CONNECTOR

(71) Applicant: Cheng Uei Precision Industry Co., LTD., New Taipei (TW)

(72) Inventors: Fang-Jin Lou, Dong-Guan (CN); Bo Liu, Dong-Guan (CN); Feng Zhu, Dong-Guan (CN)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/134,121

(22) Filed: Dec. 24, 2020

(65) Prior Publication Data
US 2021/0265751 A1    Aug. 26, 2021

(30) Foreign Application Priority Data
Feb. 20, 2020 (CN) .......................... 202020187728.0

(51) Int. Cl.
*H01R 12/65* (2011.01)
*H01R 12/59* (2011.01)
(Continued)

(52) U.S. Cl.
CPC ........... *H01R 12/65* (2013.01); *H01R 12/592* (2013.01); *H01R 13/26* (2013.01); *H01R 13/502* (2013.01);
(Continued)

(58) Field of Classification Search
CPC ...... H01R 12/65; H01R 12/592; H01R 13/26; H01R 13/502; H01R 13/6581; H05K 1/118; H05K 2201/09063
(Continued)

(56) References Cited

U.S. PATENT DOCUMENTS 7,351,093 B2 *  4/2008  Sakurai .............. H01R 13/6585
                                                            439/422
7,628,618 B2 * 12/2009  Wang ..................... H01R 12/88
                                                            439/495
(Continued)

FOREIGN PATENT DOCUMENTS

CN         207098118 U    *  3/2018
CN         207098119 U    *  3/2018
(Continued)

*Primary Examiner* — Peter G Leigh
(74) *Attorney, Agent, or Firm* — Cheng-Ju Chiang (57) ABSTRACT

An electrical connector includes an insulating housing, at least one transmission module mounted in the insulating housing, and a shell surrounding the insulating housing. The at least one transmission module includes a terminal assembly, a flexible printed circuit board and at least one pad. The terminal assembly is adhered to the flexible printed circuit board. The terminal assembly has at least one terminal which has a fastening portion. One end of the fastening portion is arched downward to form a bending portion. The flexible printed circuit board has a linking portion, and at least one conductive piece disposed to an inner surface of the linking portion. The fastening portion and the bending portion of the at least one terminal are mounted to the flexible printed circuit board. The at least one pad is disposed to the at least one conductive piece.

19 Claims, 7 Drawing Sheets

(51) Int. Cl.
  *H01R 13/26* (2006.01)
  *H01R 13/6581* (2011.01)
  *H05K 1/11* (2006.01)
  *H01R 13/502* (2006.01)

(52) U.S. Cl.
  CPC ......... *H01R 13/6581* (2013.01); *H05K 1/118* (2013.01); *H05K 2201/09063* (2013.01)

(58) Field of Classification Search
  USPC .......................................................... 439/77
  See application file for complete search history.

(56) References Cited

U.S. PATENT DOCUMENTS

| | | | |
|---|---|---|---|
| 7,670,187 B2 * | 3/2010 | Ting ..................... | H01R 12/721 |
| | | | 439/541.5 |
| 9,397,433 B2 * | 7/2016 | Kao ....................... | H01R 24/60 |
| 9,673,545 B2 * | 6/2017 | Ishida ................... | H05K 1/117 |
| 2006/0240697 A1 * | 10/2006 | Cronch ................. | H01R 12/79 |
| | | | 439/260 |

FOREIGN PATENT DOCUMENTS

| CN | 207474770 U | * | 6/2018 |
| CN | 207868561 U | * | 9/2018 |
| CN | 208062337 U | * | 11/2018 |

* cited by examiner

ELECTRICAL CONNECTOR

CROSS-REFERENCE TO RELATED APPLICATION

The present application is based on, and claims priority from, China Patent Application No. 202020187728.0, filed Feb. 20, 2020, the disclosure of which is hereby incorporated by reference herein in its entirety.

BACKGROUND OF THE INVENTION

1. Field of the Invention

The present invention generally relates to an electrical connector, and more particularly to an electrical connector having a high-speed characteristic and a signal transmission stability, and saving an internal space.

2. The Related Art

With the improvement of science and technology, a popularization of smart devices being networked brings along big data information to be continuously increased, so that requests of high-speed transmission interfaces are increased day by day. Accelerate developments of the transmission interfaces of 5G (Fifth Generation Mobile Networks), USB (Universal Serial Bus) TYPE-C and other types, a data center is led to be developed towards a higher capacity.

However, with a 5G era being arrived, connectors based on a high-speed transmission technology transmit signals with a higher speed and a lower latency to certainly make an overall design of each connector be more complicated, nonetheless, an overall cost of each connector still needs to be controlled within a certain range.

Thus, it is essential to provide an innovative electrical connector having a high-speed characteristic and a signal transmission stability, and saving an internal space.

SUMMARY OF THE INVENTION

An object of the present invention is to provide an electrical connector. The electrical connector includes an insulating housing, at least one transmission module mounted in the insulating housing, and a shell. The at least one transmission module includes a terminal assembly, a flexible printed circuit board and at least one pad. The terminal assembly is adhered to an outer surface of the flexible printed circuit board. The terminal assembly has at least one terminal. The at least one terminal has a fastening portion. One end of the fastening portion is arched downward to form a bending portion. The flexible printed circuit board has a linking portion, and at least one conductive piece disposed to one end of an inner surface of the linking portion. A surface of the at least one conductive piece is plated and is golden yellow, and the at least one conductive piece is finger-like. The fastening portion and the bending portion of the at least one terminal are mounted to the outer surface of the flexible printed circuit board. The one end of the fastening portion and the bending portion are corresponding to and located above the at least one conductive piece. The other end of the fastening portion is corresponding to and located above the other end of the inner surface of the linking portion. The at least one pad is disposed to the at least one conductive piece. The shell surrounds the insulating housing together with the at least one transmission module.

Another object of the present invention is to provide an electrical connector. The electrical connector includes an insulating housing, a flexible printed circuit board mounted in the insulating housing, a terminal assembly, a plurality of pads and a shell. The flexible printed circuit board has a linking portion, and a plurality of conductive pieces disposed to a front end of an inner surface of the linking portion. Surfaces of the plurality of the conductive pieces are plated. The plurality of the conductive pieces are abreast arranged along a transverse direction. Each conductive piece has an attaching surface at an outer surface of the conductive piece, and a fastening surface at an inner surface of the conductive piece. The terminal assembly is adhered to an outer surface of the flexible printed circuit board. The terminal assembly has a plurality of terminals which have a plurality of fastening portions. Front ends of the plurality of the fastening portions are arched downward to form a plurality of bending portions. The plurality of the fastening portions and the plurality of the bending portions are mounted to the outer surface of the flexible printed circuit board. The plurality of the bending portions are disposed to the attaching surfaces of the plurality of the conductive pieces. The front ends of the plurality of the fastening portions and the plurality of the bending portions are corresponding to and located above the plurality of the conductive pieces. Rear ends of the plurality of the fastening portions are corresponding to and located above a rear end of the inner surface of the linking portion. The plurality of the pads are disposed to the fastening surfaces of the plurality of the conductive pieces. The shell surrounds the insulating housing, the flexible printed circuit board, the terminal assembly and the plurality of the pads.

Another object of the present invention is to provide an electrical connector. The electrical connector includes an insulating housing, two transmission modules and a shell. The two transmission modules are mounted in a top and a bottom of the insulating housing. The two transmission modules are opposite to each other along an up-down direction. Each transmission module includes a terminal assembly, a flexible printed circuit board and a plurality of pads. The flexible printed circuit board has a linking portion, and a plurality of conductive pieces disposed to a front end of an inner surface of the linking portion. Surfaces of the plurality of the conductive pieces are plated and are golden yellow. The plurality of the conductive pieces are abreast arranged along a transverse direction. Each conductive piece is finger-like. The terminal assembly is adhered to an outer surface of the flexible printed circuit board. The terminal assembly has a plurality of terminals which have a plurality of fastening portions. Front ends of the plurality of the fastening portions are arched downward to form a plurality of bending portions. The plurality of the fastening portions and the plurality of the bending portions are mounted to the outer surface of the flexible printed circuit board. The front ends of the plurality of the fastening portions and the plurality of the bending portions are corresponding to and located above the plurality of the conductive pieces. Rear ends of the plurality of the fastening portions are corresponding to and located above a rear end of the inner surface of the linking portion. The plurality of the pads are disposed to a front end of an inner surface of the flexible printed circuit board and is corresponding to a front end of the terminal assembly. The shell surrounds the insulating housing and the two transmission modules.

As described above, the two terminal assemblies of the two transmission modules are adhered to the two outer surfaces of the two flexible printed circuit boards of the two transmission modules by a hot melt glue, so the electrical connector saves an internal space and has a signal transmission stability by the two transmission modules, and the electrical connector has a more steady maintaining force by the two transmission modules to be beneficial for a production and a manufacture of the electrical connector. Furthermore, the plurality of the pads are disposed to the fastening surfaces of the plurality of the conductive pieces, and the plurality of the bending portions are disposed to the attaching surfaces of the plurality of the conductive pieces. Thus, a signal interference is without being caused between the plurality of the pads and the flexible printed circuit board of each transmission module, and the plurality of the pads and the flexible printed circuit board of each transmission module increase the signal transmission stability. As a result, the electrical connector has a high-speed characteristic and the signal transmission stability, and saves the internal space.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

With reference to FIG. 1 to FIG. 4, an electrical connector 100 in accordance with a preferred embodiment of the present invention is shown. The electrical connector 100 includes an insulating housing 1, at least one transmission module 2, at least one shielding plates 3, at least one latch 4, at least one location block 5 and a shell 6. In the preferred embodiment, the electrical connector 100 includes two transmission modules 2, two shielding plates 3, two latches 4 and two location blocks 5. The shell 6 surrounds the insulating housing 1, the two transmission modules 2, the two shielding plates 3, the two latches 4 and the two location blocks 5.

The at least one transmission module 2 is mounted in the insulating housing 1. The at least one transmission module 2 includes a terminal assembly 21, a flexible printed circuit (FPC) board 22 and at least one pad 23. The terminal assembly 21 is adhered to an outer surface 201 of the flexible printed circuit board 22 by a hot melt glue. The terminal assembly 21 has at least one terminal 210. The at least one terminal 210 has a fastening portion 211, a bending portion 212, a contact portion 213, a connecting portion 214, an extending portion 215 and two first location feet 217. One end of the fastening portion 211 is arched downward to form the bending portion 212. The flexible printed circuit board 22 of the at least one transmission module 2 has a linking portion 221, and at least one conductive piece 222 disposed to one end of an inner surface of the linking portion 221 of the flexible printed circuit board 22. A surface of the at least one conductive piece 222 is plated and is golden yellow, and the at least one conductive piece 222 is finger-like. The fastening portion 211 and the bending portion 212 of the at least one terminal 210 are mounted to the outer surface 201 of the flexible printed circuit board 22. The one end of the fastening portion 211 and the bending portion 212 are corresponding to and are located above the at least one conductive piece 222. The other end of the fastening portion 211 is corresponding to and is located above the other end of the inner surface of the linking portion 221. The at least one pad 23 is disposed to the at least one conductive piece 222. The shell 6 surrounds the insulating housing 1 together with the at least one transmission module 2.

The two transmission modules 2 are disposed horizontally. The two transmission modules 2 are mounted in middles and rears of a top and a bottom of the insulating housing 1. The two transmission modules 2 are opposite to each other along an up-down direction. The two shielding plates 3 are disposed horizontally. The two shielding plates 3 are mounted to fronts of the top and the bottom of the insulating housing 1. The two shielding plates 3 are opposite to each other along the up-down direction. The two shielding plates 3 are located in front of the two transmission modules 2. The two latches 4 are disposed vertically. The two latches 4 are mounted to two opposite sides of the insulating housing 1. The two latches 4 are opposite to each other along a transverse direction. The two location blocks 5 are disposed horizontally. The two location blocks 5 are mounted to the rears of the top and the bottom of the insulating housing 1. The two location blocks 5 are opposite to each other along the up-down direction. The two location blocks 5 are located to outer surfaces of the two transmission modules 2.

The insulating housing 1, the at least one transmission module 2, the at least one shielding plate 3, the at least one latch 4 and the at least one location block 5 are surrounded by the shell 6. In the preferred embodiment, the insulating housing 1, the two transmission modules 2, the two shielding plates 3, the two latches 4 and the two location blocks 5 are surrounded by the shell 6. The electrical connector 100 has a better shielding function to reduce an external disturbance to make a signal transmitted more steadily.

Figure 3:
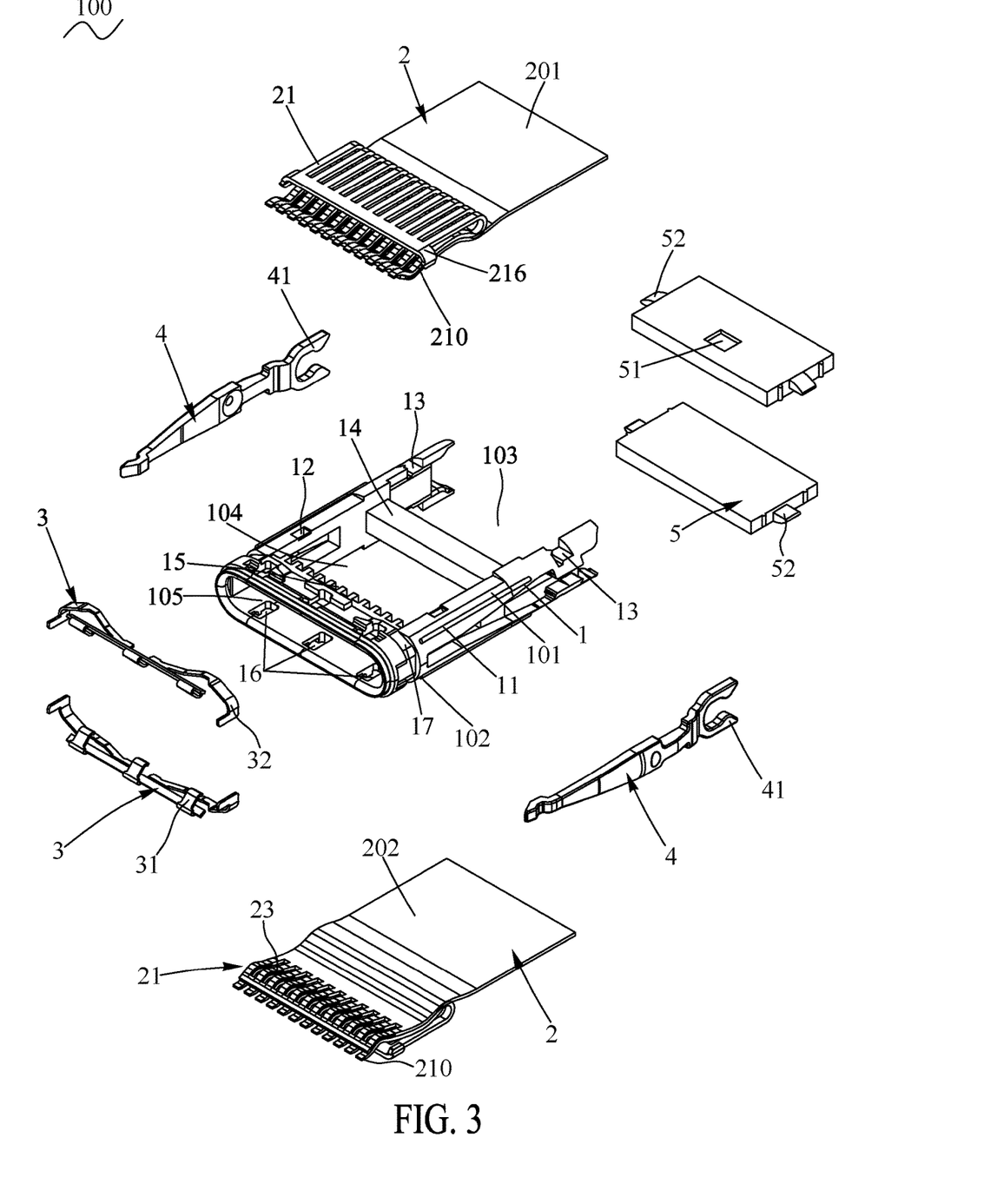
FIG. 3 is an exploded view of the electrical connector of FIG. 1.
Figure 4:
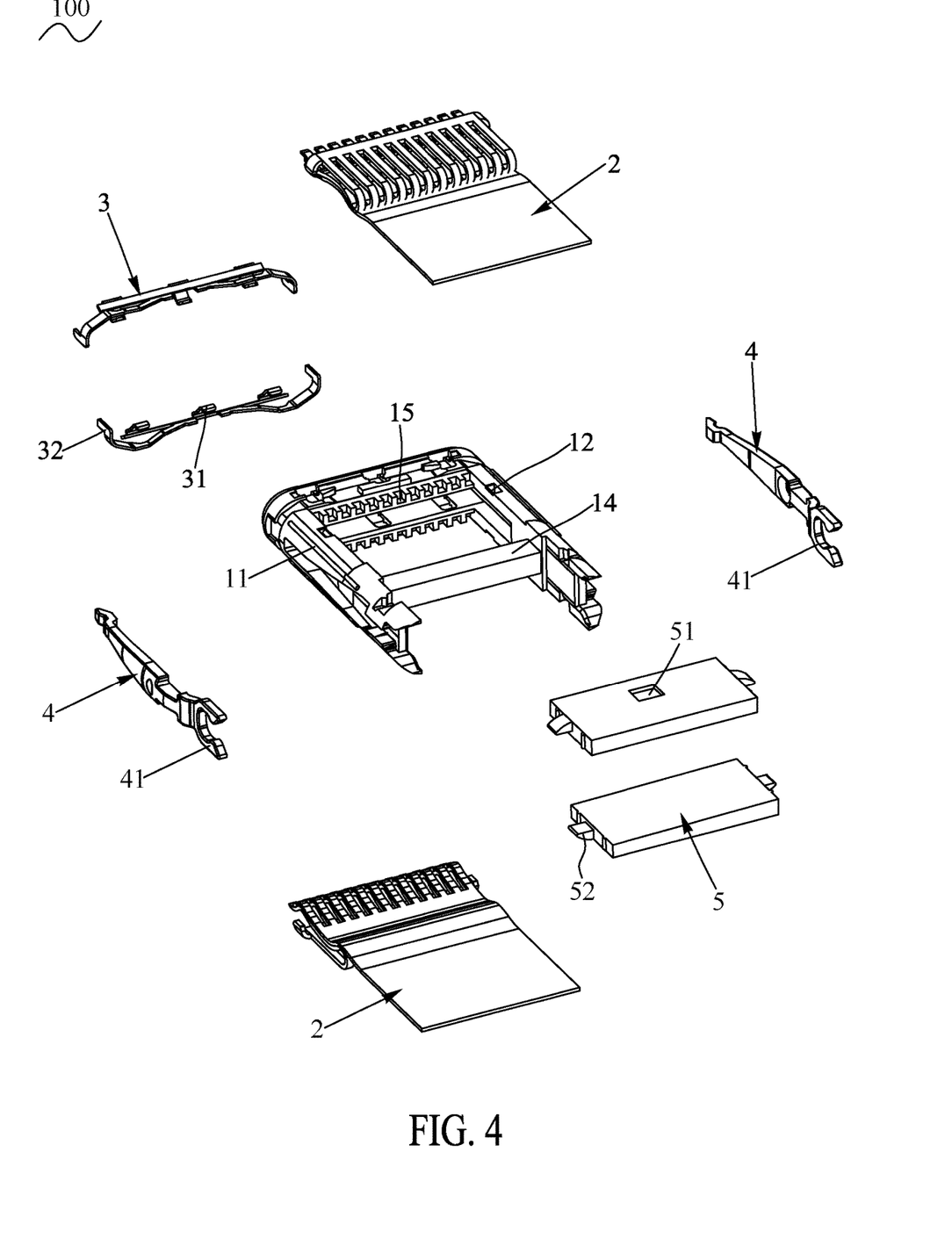
FIG. 4 is another exploded view of the electrical connector of FIG. 1.
Figure 5:
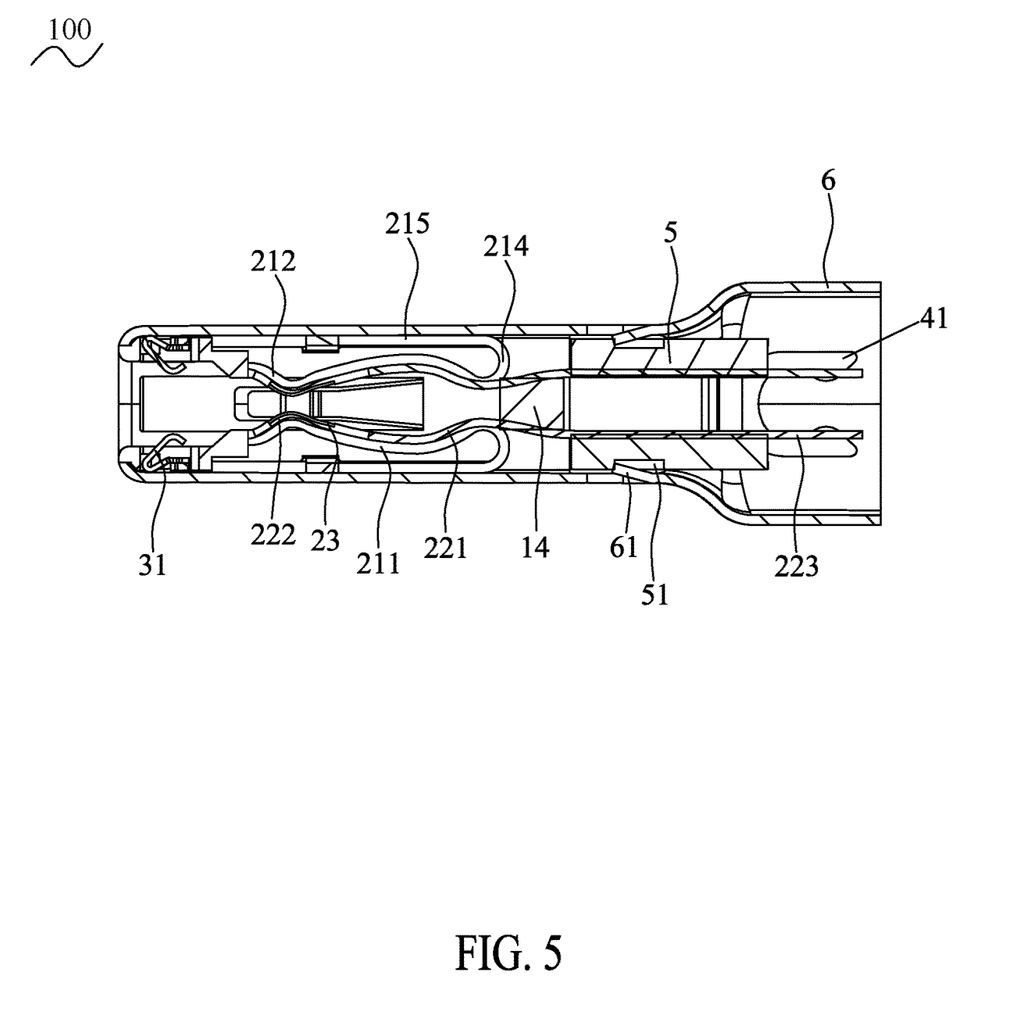
FIG. 5 is a sectional view of the electrical connector along a line V-V of FIG. 1.

Referring to FIG. 3 to FIG. 5, the insulating housing 1 has a plurality of protruding ribs 11, a plurality of first location holes 12, a plurality of second location holes 13, a connecting block 14, a plurality of receiving grooves 15, a plurality of perforations 16 and a plurality of buckling grooves 17.

Middles of two opposite sides of an upper surface 101 and two opposite sides of a lower surface 102 of the insulating housing 1 protrude outward to the plurality of the corresponding protruding ribs 11. When the shell 6 is assembled to the insulating housing 1, the plurality of the protruding ribs 11 of the insulating housing 1 are interfered with the shell 6. In the preferred embodiment, the middles of the two opposite sides of the upper surface 101 of the insulating housing 1 protrude oppositely outward to form two protruding ribs 11. The middles of the two opposite sides of the lower surface 102 of the insulating housing 1 protrude oppositely outward to form another two protruding ribs 11.

Front ends of the two opposite sides of the upper surface 101 and front ends of the two opposite sides of the lower surface 102 of the insulating housing 1 are recessed inward to form the plurality of the corresponding first location holes 12. The plurality of the first location holes 12 are located adjacent to and are spaced from inner sides of the plurality of the protruding ribs 11. Inner walls of the plurality of the first location holes 12 of the insulating housing 1 are used for abutting against corresponding mechanisms of the two transmission modules 2 to realize a location and a fixation between the insulating housing 1 and the two transmission modules 2. Rear ends of the two opposite sides of the upper surface 101 and rear ends of the two opposite sides of lower surface 102 of the insulating housing 1 are recessed inward to form the plurality of the corresponding second location holes 13. Inner walls of the plurality of the second location holes 13 of the insulating housing 1 are used for abutting against corresponding structures of the two location blocks 5 to realize a location and a fixation between the insulating housing 1 and the two location blocks 5.

In the preferred embodiment, the front ends of the two opposite sides of the upper surface 101 of the insulating housing 1 are recessed inward to form two first location holes 12. The two first location holes 12 of the upper surface 101 of the insulating housing 1 are aligned along the transverse direction. The front ends of the two opposite sides of the lower surface 102 of the insulating housing 1 are recessed inward to form another two first location holes 12. The two first location holes 12 of the lower surface 102 of the insulating housing 1 are aligned along the transverse direction. The rear ends of the two opposite sides of the upper surface 101 of the insulating housing 1 are recessed inward to form two second location holes 13. The two second location holes 13 of the upper surface 101 of the insulating housing 1 are aligned along the transverse direction. The rear ends of the two opposite sides of lower surface 102 of the insulating housing 1 are recessed inward to form another two second location holes 13. The two second location holes 13 of the lower surface 102 of the insulating housing 1 are aligned along the transverse direction. Each second location hole 13 is in alignment with one first location hole 12 along a longitudinal direction.

The insulating housing 1 has a lacking groove 103 penetrating through the middles and the rear ends of the upper surface 101 and the lower surface 102 of the insulating housing 1, and a middle of a rear surface of the insulating housing 1. The connecting block 14 is connected between middles of inner surfaces of two side walls of the lacking groove 103 of the insulating housing 1. The connecting block 14 is located among the plurality of the first location holes 12 and the plurality of the second location holes 13. In the preferred embodiment, the connecting block 14 is shown as a rectangular shape. The connecting block 14 is located and abutted between the two transmission modules 2. The connecting block 14 is used for separating the two transmission modules 2, so that the two transmission modules 2 are arranged opposite to each other and along the up-down direction, and the two transmission modules 2 are contactless.

Several portions of two front ends of two middles of the upper surface 101 and the lower surface 102 of the insulating housing 1 are recessed inward to form the plurality of the receiving grooves 15. The plurality of the receiving grooves 15 is located in front of the lacking groove 103. The plurality of the receiving grooves 15 are located in front of an interval 104 formed among the plurality of the first location holes 12. The interval 104 is a front end of the lacking groove 103. The plurality of the receiving grooves 15 are used for receiving corresponding parts of the two transmission modules 2 to realize the location and the fixation between the insulating housing 1 and the two transmission modules 2.

A front end of the insulating housing 1 defines an accommodating space 105 penetrating through the front end of the insulating housing 1 along the longitudinal direction. The accommodating space 105 is communicated between the lacking groove 103 and an outside space. The front end of the insulating housing 1 defines the plurality of the perforations 16 penetrating through a top wall and a bottom wall of the accommodating space 105. The plurality of the perforations 16 penetrate through the two front ends of the two middles of the upper surface 101 and the lower surface 102 of the insulating housing 1. The plurality of the perforations 16 are located in front of the plurality of the receiving grooves 15. Corresponding sections of the shielding plate 3 are fastened to the plurality of the perforations 16 for realizing a location and a fixation between the shielding plate 3 and the insulating housing 1. In the preferred embodiment, the insulating housing 1 has three perforations 16 penetrating through the upper surface 101, and the insulating housing 1 has another three perforations 16 penetrating through the lower surface 102 of the insulating housing 1.

The front ends of the two opposite sides of the upper surface 101 and the front ends of the two opposite sides of the lower surface 102 of the insulating housing 1 are recessed inward to form the plurality of the buckling grooves 17. The plurality of the buckling grooves 17 are disposed among the plurality of the receiving grooves 15 and the plurality of the perforations 16. The plurality of the buckling grooves 17 are used for being buckled with corresponding segments of the two shielding plates 3 to realize the location and the fixation between the insulating housing 1 and the two shielding plates 3. In the preferred embodiment, the front ends of the two opposite sides of the upper surface 101 of the insulating housing 1 are recessed inward to form two buckling grooves 17. The front ends of the two opposite sides of the lower surface of the insulating housing 1 are recessed inward to form another two buckling grooves 17.

Figure 6:
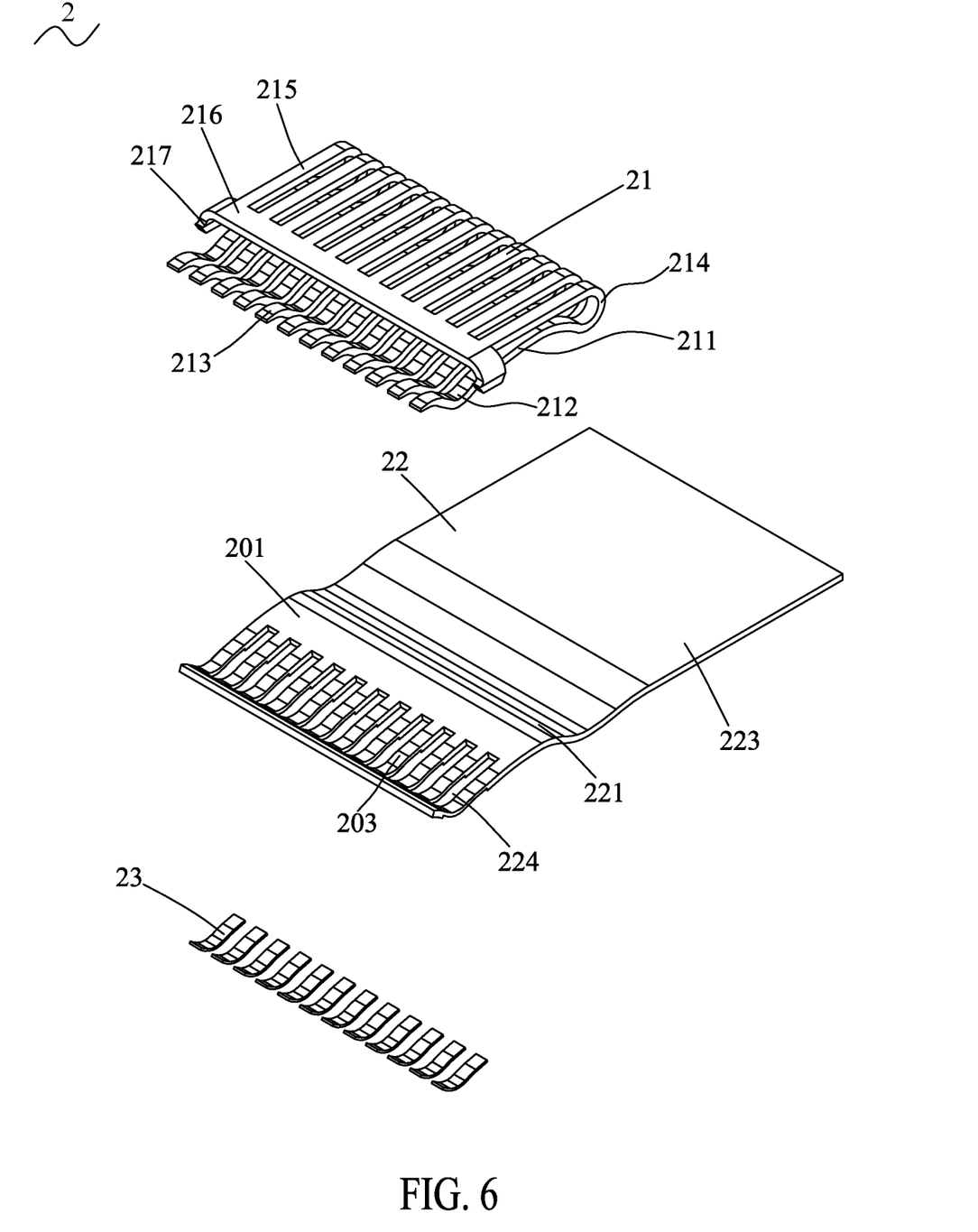
FIG. 6 is an exploded view of a transmission module of the electrical connector of FIG. 1.
Figure 7:
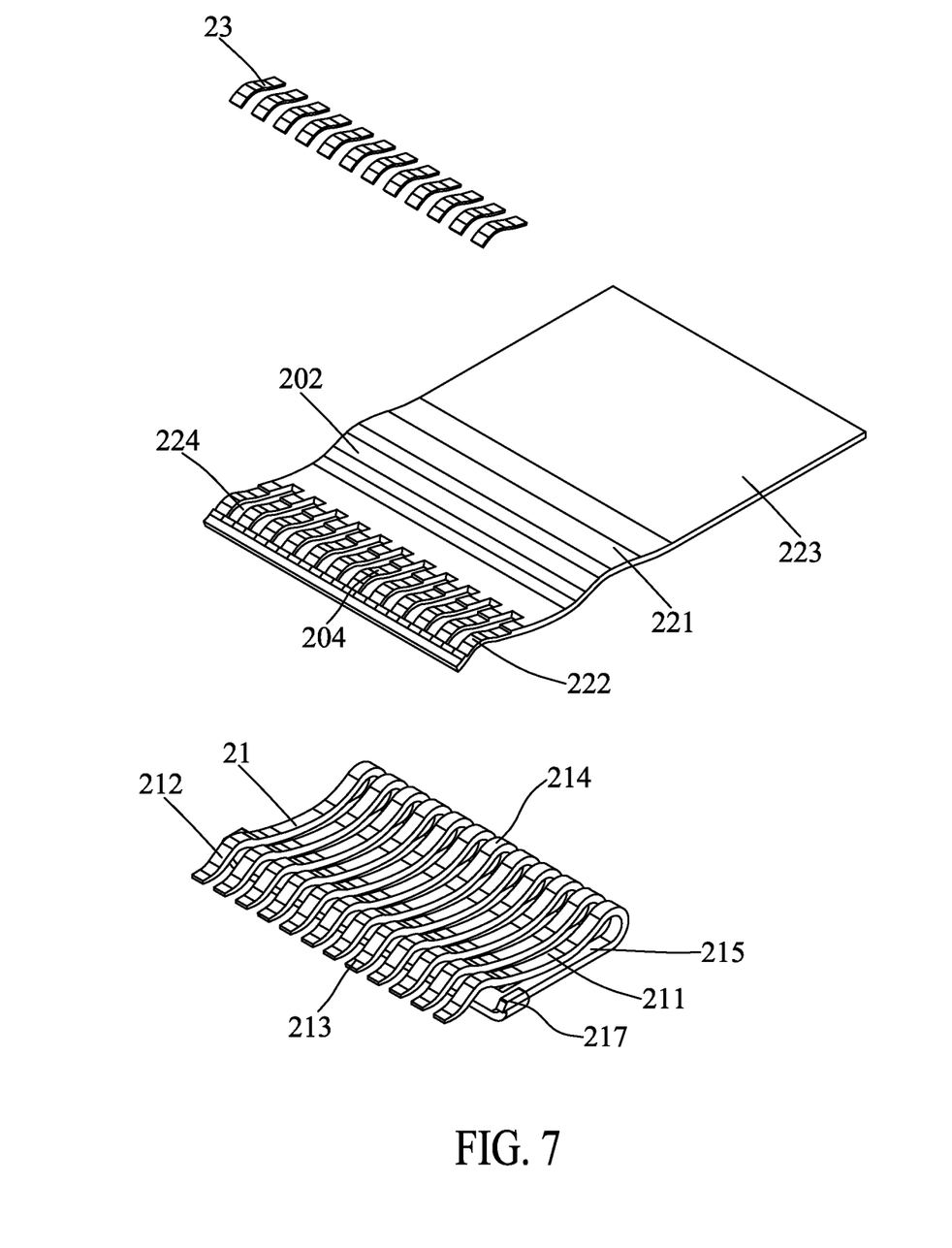
FIG. 7 is another exploded view of the transmission module of the electrical connector of FIG. 1.

Referring to FIG. 5 to FIG. 7, the two transmission modules 2 are fastened to the middles and the rears of the top and the bottom of the insulating housing 1 and are opposite to each other along the up-down direction. Each transmission module 2 includes the terminal assembly 21, the flexible printed circuit (FPC) board 22 and a plurality of pads 23. In each transmission module 2, the terminal assembly 21 is adhered to a front end of the outer surface 201 of the flexible printed circuit board 22 by the hot melt glue, so the electrical connector 100 saves an internal space, and the plurality of the pads 23 are disposed to a front end of an inner surface 202 of the flexible printed circuit board 22 and are corresponding to a front end of the terminal assembly 21, so the electrical connector 100 saves more internal space and has a more steady maintaining force to be beneficial for a production and a manufacture of the electrical connector 100.

The terminal assembly 21 of each transmission module 2 has a strengthening portion 216, and a plurality of the terminals 210 fastened to the strengthening portion 216. The plurality of the terminals 210 of each transmission module 2 have a plurality of fastening portions 211, a plurality of bending portions 212, a plurality of contact portions 213, a plurality of connecting portions 214, a plurality of extending portions 215 and the two first location feet 217. The plurality of the fastening portions 211 of the plurality of the terminals 210 of each transmission module 2 are arc-shaped designs. The plurality of the pads 23 are disposed corresponding to the plurality of the terminals 210. The plurality of the fastening portions 211 and the plurality of the bending portions 212 are mounted to the outer surface 201 of the flexible printed circuit board 22.

The plurality of the terminals 210 are a curved design. Each terminal 210 has the fastening portion 211. In each transmission module 2, inner surfaces of the plurality of the fastening portions 211 of the terminal assembly 21 are adhered to the front end of the outer surface 201 of the flexible printed circuit board 22 by the hot melt glue, so the electrical connector 100 saves the internal space, front ends of the plurality of the fastening portions 211 are arched downward to form the plurality of the bending portions 212, front ends of the plurality of the bending portions 212 extend frontward to form the plurality of the contact portions 213, and the plurality of the contact portions 213 are connected to the front ends of the plurality of the bending portions 212 and are exposed out from a front end of the flexible printed circuit board 22. The plurality of the contact portions 213 of the two transmission modules 2 are disposed in the plurality of the receiving grooves 15 of the insulating housing 1 for realizing a location and a fixation between each transmission module 2 and the insulating housing 1.

Rear ends of the plurality of the fastening portions 211 are bent upward and then are arched outward to form the plurality of the connecting portions 214. Free ends of the plurality of the connecting portions 214 extend frontward and along an extending direction of the plurality of the contact portions 213 to form the plurality of the extending portions 215. The plurality of the extending portions 215 are located above the plurality of the contact portions 213. In each transmission module 2, free ends of the plurality of the extending portions 215 are connected together to form the strengthening portion 216, the strengthening portion 216 is used for reinforcing each transmission module 2 to be disposed in the insulating housing 1. In each transmission module 2, two opposite sides of the strengthening portion 216 are bent outward and then extend downward to form the two first location feet 217. The first location feet 217 of each transmission module 2 are fastened in the plurality of the first location holes 12 of the insulating housing 1 for realizing the location and the fixation between each transmission module 2 and the insulating housing 1. In the preferred embodiment, the first location feet 217 of the two transmission modules 2 are fastened in the plurality of the first location holes 12 of the insulating housing 1 for realizing the location and the fixation between the two transmission modules 2 and the insulating housing 1.

Referring to FIG. 4 to FIG. 7, the flexible printed circuit board 22 of each transmission module 2 has the linking portion 221, a plurality of the conductive pieces 222, a soldering portion 223, and a plurality of gaps 224. Surfaces of the plurality of the conductive pieces 222 are plated and are golden yellow. The plurality of the conductive pieces 222 are abreast arranged along the transverse direction. Each conductive piece 222 is finger-like. A middle of the flexible printed circuit board 22 of each transmission module 2 has the linking portion 221. A middle of the linking portion 221 is slightly arched outward to show an arc shape. The middle of the linking portion 221 is slightly curved towards the insulating housing 1. A curving direction of the linking portion 221 of the flexible printed circuit board 22 of each transmission module 2 is cooperated with a design of the plurality of the fastening portions 211 of the terminal assembly 21 of each transmission module 2. The linking portion 221 of the flexible printed circuit board 22 of each transmission module 2 is corresponding to the plurality of the fastening portions 211 of the terminal assembly 21 of each transmission module 2, so that the terminal assembly 21 and the flexible printed circuit board 22 of each transmission module 2 are adhered by the hot melt glue. In the preferred embodiment, the connecting block 14 abuts between and is clamped between the two linking portions 221 of the two transmission modules 2 to separate the two transmission modules 2. The front ends of the plurality of the fastening portions 211 and the plurality of the bending portions 212 are corresponding to and located above the plurality of the conductive pieces 222. The rear ends of the plurality of the fastening portions 211 are corresponding to and located above a rear end of the inner surface of the linking portion 221.

In each transmission module 2, the plurality of the conductive pieces 222 are disposed to a front end of the inner surface of the linking portion 221 of the flexible printed circuit board 22. In each transmission module 2, the plurality of the bending portions 212 are disposed to the front end of the outer surface 201 of the flexible printed circuit board 22 and are opposite to the plurality of the conductive pieces 222, the plurality of the pads 23 are mounted on the plurality of the conductive pieces 222, and the plurality of the conductive pieces 222 are spaced from one another, so the plurality of the conductive pieces 222 will be without being disturbed by interference signals, and the plurality of the pads 23 will be also without being disturbed by the interference signals, simultaneously, a signal transmission stability is increased. In each transmission module 2, each conductive piece 222 has an attaching surface 203 at an outer surface of the conductive piece 222, and a fastening surface 204 at an inner surface of the conductive piece 222 and opposite to the attaching surface 203. The plurality of the pads 23 are disposed to the fastening surfaces 204 of the plurality of the conductive pieces 222. The plurality of the bending portions 212 are disposed to the attaching surfaces 203 of the plurality of the conductive pieces 222. Thus, a signal interference is without being caused between the plurality of the pads 23 and the flexible printed circuit board 22 of each transmission module 2, and the plurality of the pads 23 and the flexible printed circuit board 22 of each transmission module 2 increase the signal transmission stability.

A rear end of the linking portion 221 of the flexible printed circuit board 22 of each transmission module 2 extends rearward to form the soldering portion 223. Each location block 5 is disposed to an outer surface of the soldering portion 223 of the flexible printed circuit board 22 of one transmission module 2. The soldering portion 223 of the flexible printed circuit board 22 of each transmission module 2 is soldered to a circuitry board (not shown). The two soldering portions 223 of the two flexible printed circuit boards 22 of the two transmission modules 2 are disposed horizontally and are corresponding to each other. The two soldering portions 223 of the two transmission modules 2 are fastened in the insulating housing 1 and are disposed opposite to each other along the up-down direction. Each two adjacent conductive pieces 222 are spaced to form a gap 224 between each two adjacent conductive pieces 222. The plurality of the gaps 224 are used for identifying location positions of the terminal assembly 21 and the flexible printed circuit board 22 of each transmission module 2. The plurality of the gaps 224 are spaced from one another.

Referring to FIG. 3 and FIG. 4, in the preferred embodiment, the two shielding plates 3 are disposed horizontally. The two shielding plates 3 are fastened to the front end of the insulating housing 1. The two shielding plates 3 are fastened to front ends of the upper surface 101 and the lower surface 102 of the insulating housing 1. The two shielding plates 3 are opposite to each other along the up-down direction. Each shielding plate 3 has a plurality of elastic slices 31 and at least two fastening plates 32. In the preferred embodiment, each shielding plate 3 has the plurality of the elastic slices 31 and two fastening plates 32. Several portions of a front end of each shielding plate 3 slantwise extend rearward and inward, and then slantwise extend rearward and outward to form the plurality of the elastic slices 31. The plurality of the elastic slices 31 of each shielding plate 3 are spaced from one another. The plurality of the elastic slices 31 of the two shielding plates 3 are fastened in the plurality of the perforations 16 of the insulating housing 1 for realizing a location and a fixation between the two shielding plates 3 and the insulating housing 1. When the electrical connector 100 is inserted into or withdrawn from a docking connector (not shown), the plurality of the elastic slices 31 of the two shielding plates 3 are used for contacting with docking elements (not shown) of the docking connector and providing a maintaining force of the electrical connector 100. In the preferred embodiment, each shielding plate 3 has three elastic slices 31. Two portions of a rear end of each shielding plate 3 slantwise extend rearward and outward, and then are bent inward to form the two fastening plates 32. The fastening plates 32 of the two shielding plates 3 are corresponding to and fastened in the plurality of the buckling grooves 17 of the insulating housing 1 for realizing the location and the fixation between the two shielding plates 3 and the insulating housing 1.

Referring to FIG. 2 to FIG. 5, the two latches 4 are fastened to the two sides of the insulating housing 1, and the two latches 4 are opposite to each other along the transverse direction. A rear end of each latch 4 has a gripper 41. The gripper 41 is used for clamping the circuitry board. The two location blocks 5 are disposed horizontally. The two location blocks 5 are disposed on the two outer surfaces of the two soldering portions 223 of the two flexible printed circuit boards 22 of the two transmission modules 2. Each location block 5 has a location portion 51 and at least two second location feet 52. In the preferred embodiment, each location block 5 has the location portion 51 and two second location feet 52. A middle of a top surface of each location block 5 is recessed inward to from the location portion 51. Corresponding portions of the shell 6 are buckled in the two location portions 51 of the two location blocks 5 for realizing a location and a fixation between the two location blocks 5 and the shell 6. Middles of two opposite sides of each location block 5 extend outward to form the two second location feet 52. The second location feet 52 of the two location blocks 5 are fastened to the plurality of the second location holes 13 for realizing the location and the fixation between the two location blocks 5 and the insulating housing 1. The shell 6 surrounds the insulating housing 1, the flexible printed circuit board 22, the terminal assembly 21 and the plurality of the pads 23.

Figure 1:
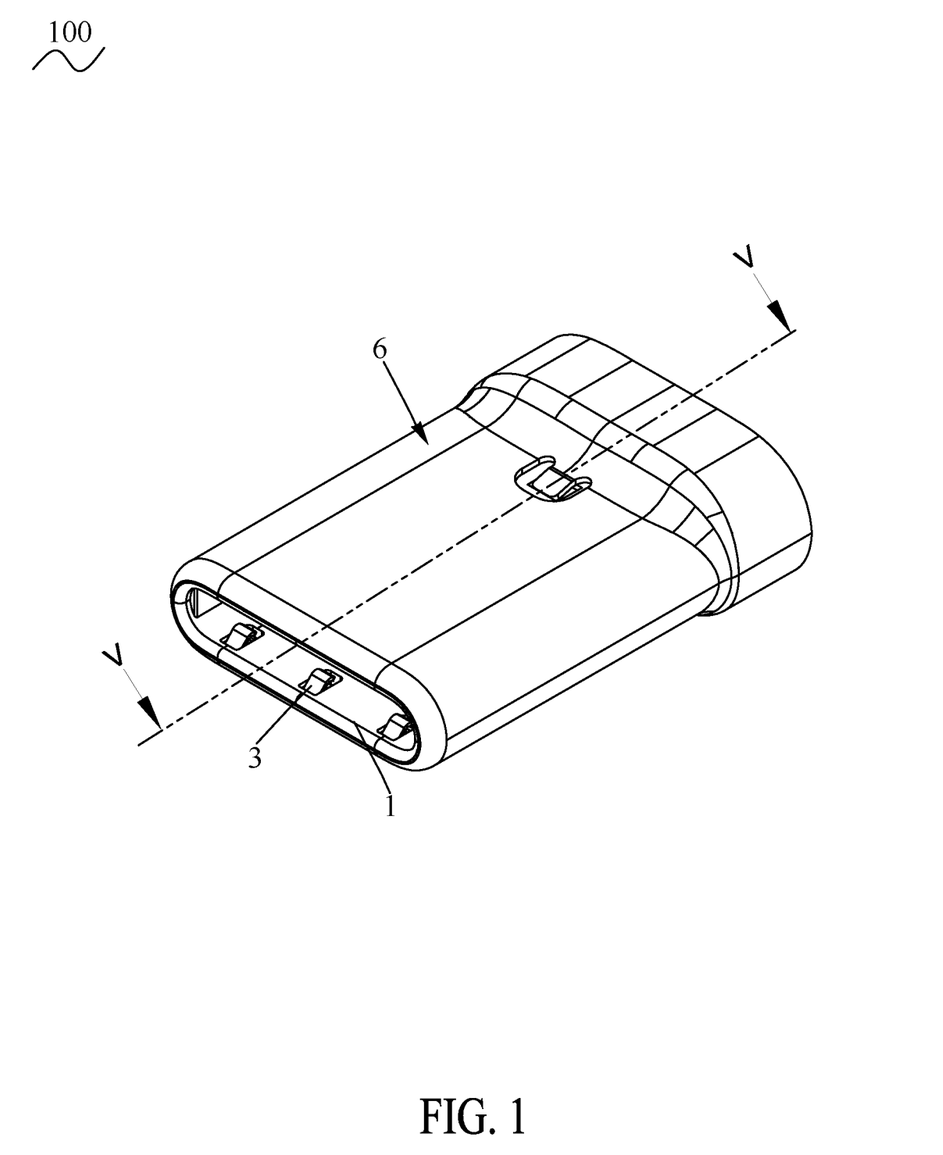
FIG. 1 is a perspective view of an electrical connector in accordance with a preferred embodiment of the present invention.
Figure 2:
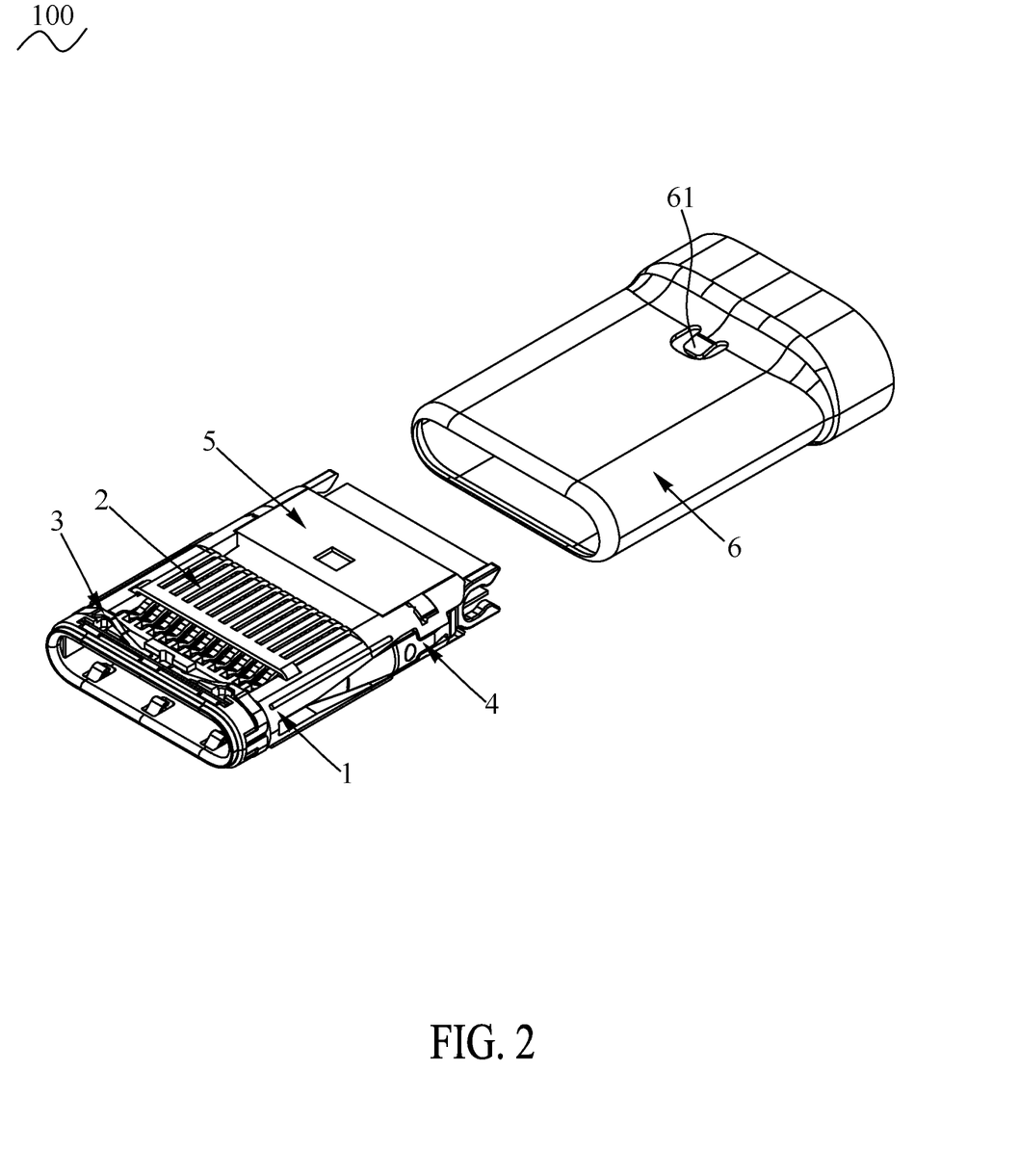
FIG. 2 is a partially exploded view of the electrical connector of FIG. 1.

Referring to FIG. 1, FIG. 2 and FIG. 5, the shell 6 is a hollow tube shape. Middles of an upper portion and a lower portion of the shell 6 are punched inward to form two buckling portions 61 towards each other. The two buckling portions 61 are buckled in the two location portions 51 of the two location blocks 5 for realizing the location and the fixation between the shell 6 and the two location blocks 5.

As described above, the two terminal assemblies 21 of the two transmission modules 2 are adhered to the two outer surfaces 201 of the two flexible printed circuit boards 22 of the two transmission modules 2 by the hot melt glue, so the electrical connector 100 saves the internal space and has the signal transmission stability by the two transmission modules 2, and the electrical connector 100 has the more steady maintaining force by the two transmission modules 2 to be beneficial for the production and the manufacture of the electrical connector 100. Furthermore, the plurality of the pads 23 are disposed to the fastening surfaces 204 of the plurality of the conductive pieces 222, and the plurality of the bending portions 212 are disposed to the attaching surfaces 203 of the plurality of the conductive pieces 222. Thus, the signal interference is without being caused between the plurality of the pads 23 and the flexible printed circuit board 22 of each transmission module 2, and the plurality of the pads 23 and the flexible printed circuit board 22 of each transmission module 2 increase the signal transmission stability. As a result, the electrical connector 100 has a high-speed characteristic and the signal transmission stability, and saves the internal space.

What is claimed is:

1. An electrical connector, comprising:
an insulating housing;
at least one transmission module mounted in the insulating housing, the at least one transmission module including a terminal assembly, a flexible printed circuit board and at least one pad, the terminal assembly being adhered to an outer surface of the flexible printed circuit board, the terminal assembly having at least one terminal, the at least one terminal having a fastening portion, one end of the fastening portion being arched downward to form a bending portion, the flexible printed circuit board having a linking portion, and at least one conductive piece disposed to one end of an inner surface of the linking portion, a surface of the at least one conductive piece being plated and being golden yellow, and the at least one conductive piece being finger-like, the fastening portion and the bending portion of the at least one terminal being mounted to the outer surface of the flexible printed circuit board, the one end of the fastening portion and the bending portion being corresponding to and located above the at least one conductive piece, the other end of the fastening portion being corresponding to and located above the other end of the inner surface of the linking portion, the at least one pad being disposed to the at least one conductive piece; and
a shell surrounding the insulating housing together with the at least one transmission module.

2. The electrical connector as claimed in claim 1, wherein the electrical connector includes two transmission modules mounted in middles and rears of a top and a bottom of the insulating housing, the two transmission modules are opposite to each other along an up-down direction, each transmission module includes the terminal assembly, the flexible printed circuit board and a plurality of pads, in each transmission module, the terminal assembly is adhered to a front end of the outer surface of the flexible printed circuit board, and the plurality of the pads are disposed to a front end of an inner surface of the flexible printed circuit board and are corresponding to a front end of the terminal assembly.

3. The electrical connector as claimed in claim 1, wherein the flexible printed circuit board of each transmission module has a plurality of the conductive pieces abreast arranged along a transverse direction, the plurality of the conductive pieces are disposed to a front end of the inner surface of the linking portion of the flexible printed circuit board, each two adjacent conductive pieces are spaced to form a gap between each two adjacent conductive pieces.

4. The electrical connector as claimed in claim 1, wherein the terminal assembly of each transmission module has a strengthening portion, and a plurality of the terminals fastened to the strengthening portion, the plurality of the terminals have a plurality of the fastening portions, front ends of the plurality of the fastening portions are arched downward to form a plurality of the bending portions, the plurality of the fastening portions and the plurality of the bending portions are mounted to the outer surface of the flexible printed circuit board.

5. The electrical connector as claimed in claim 4, wherein the terminal assembly is adhered to the outer surface of the flexible printed circuit board by a hot melt glue, a middle of the flexible printed circuit board of each transmission module has the linking portion, a middle of the linking portion is slightly arched outward to show an arc shape, rear ends of the plurality of the fastening portions are corresponding to and located above a rear end of the inner surface of the linking portion.

6. The electrical connector as claimed in claim 4, wherein the plurality of the terminals of each transmission module have a plurality of contact portions, a plurality of connecting portions, a plurality of extending portions and two first location feet, the plurality of the fastening portions of the plurality of the terminals of each transmission module are arc-shaped designs, front ends of the plurality of the bending portions extend frontward to form the plurality of the contact portions, and the plurality of the contact portions are exposed out from a front end of the flexible printed circuit board, rear ends of the plurality of the fastening portions are bent upward and then are arched outward to form the plurality of the connecting portions, free ends of the plurality of the connecting portions extend frontward and along an extending direction of the plurality of the contact portions to form the plurality of the extending portions, in each transmission module, free ends of the plurality of the extending portions are connected together to form the strengthening portion, two opposite sides of the strengthening portion are bent outward and then extend downward to form the two first location feet.

7. The electrical connector as claimed in claim 6, wherein middles of two opposite sides of an upper surface and two opposite sides of a lower surface of the insulating housing protrude outward to a plurality of protruding ribs, when the shell is assembled to the insulating housing, the plurality of the protruding ribs of the insulating housing are interfered with the shell.

8. The electrical connector as claimed in claim 7, wherein front ends of the two opposite sides of the upper surface and front ends of the two opposite sides of the lower surface of the insulating housing are recessed inward to form a plurality of first location holes located adjacent to and spaced from inner sides of the plurality of the protruding ribs, the first location feet of each transmission module are fastened in the plurality of the first location holes.

9. The electrical connector as claimed in claim 8, wherein the electrical connector includes two transmission modules mounted in middles and rears of a top and a bottom of the insulating housing, and two location blocks disposed horizontally, the two location blocks are mounted to the rears of the top and the bottom of the insulating housing, the two location blocks are opposite to each other along an up-down direction, the two location blocks are located to outer surfaces of the two transmission modules, rear ends of the two opposite sides of the upper surface and rear ends of the two opposite sides of lower surface of the insulating housing are recessed inward to form a plurality of second location holes, middles of two opposite sides of each location block extend outward to form two second location feet, the second location feet of the two location blocks are fastened to the plurality of the second location holes.

10. The electrical connector as claimed in claim 9, wherein a rear end of the linking portion of the flexible printed circuit board of each transmission module extends rearward to form a soldering portion, each location block is disposed to an outer surface of the soldering portion of the flexible printed circuit board of one transmission module.

11. The electrical connector as claimed in claim 9, wherein a top surface of each location block is recessed inward to from a location portion, middles of an upper portion and a lower portion of the shell are punched inward to form two buckling portions towards each other, the two buckling portions are buckled in the two location portions of the two location blocks.

12. The electrical connector as claimed in claim 9, wherein the insulating housing has a lacking groove penetrating through middles and rear ends of the upper surface and the lower surface of the insulating housing, and a middle of a rear surface of the insulating housing, the insulating housing has a connecting block connected between middles of inner surfaces of two side walls of the lacking groove, the connecting block is located among the plurality of the first location holes and the plurality of the second location holes, the connecting block is shown as a rectangular shape, the connecting block is located and abutted between the two transmission modules, the connecting block is used for separating the two transmission modules.

13. The electrical connector as claimed in claim 12, wherein several portions of two front ends of two middles of the upper surface and the lower surface of the insulating housing are recessed inward to form a plurality of the receiving grooves located in front of the lacking groove, the plurality of the receiving grooves are located in front of an interval formed among the plurality of the first location holes, the plurality of the contact portions of the two transmission modules are disposed in the plurality of the receiving grooves.

14. The electrical connector as claimed in claim 13, wherein a front end of the insulating housing defines an accommodating space penetrating through the front end of the insulating housing along a longitudinal direction, the accommodating space is communicated between the lacking groove and an outside space, the front end of the insulating housing defines a plurality of perforations penetrating through a top wall and a bottom wall of the accommodating space, the plurality of the perforations penetrate through two front ends of two middles of the upper surface and the lower surface of the insulating housing, the plurality of the perforations are located in front of the plurality of the receiving grooves, the electrical connector includes two shielding plates mounted to fronts of the top and the bottom of the insulating housing, several portions of a front end of each shielding plate slantwise extend rearward and inward, and then slantwise extend rearward and outward to form a plurality of elastic slices, the plurality of the elastic slices of the two shielding plates are fastened in the plurality of the perforations.

15. The electrical connector as claimed in claim 14, wherein the front ends of the two opposite sides of the upper surface and the front ends of the two opposite sides of the lower surface of the insulating housing are recessed inward to form a plurality of buckling grooves disposed among the plurality of the receiving grooves and the plurality of the perforations, two portions of a rear end of each shielding plate slantwise extend rearward and outward, and then are bent inward to form two fastening plates, the fastening plates of the two shielding plates are corresponding to and fastened in the plurality of the buckling grooves of the insulating housing.

16. The electrical connector as claimed in claim 1, further comprising two latches mounted to two opposite sides of the insulating housing, the two latches being opposite to each other along a transverse direction.

17. An electrical connector, comprising:
an insulating housing;
a flexible printed circuit board mounted in the insulating housing, the flexible printed circuit board having a linking portion, and a plurality of conductive pieces disposed to a front end of an inner surface of the linking portion, surfaces of the plurality of the conductive pieces being plated, the plurality of the conductive pieces being abreast arranged along a transverse direction, each conductive piece having an attaching surface at an outer surface of the conductive piece, and a fastening surface at an inner surface of the conductive piece;
a terminal assembly adhered to an outer surface of the flexible printed circuit board, the terminal assembly having a plurality of terminals which have a plurality of fastening portions, front ends of the plurality of the fastening portions being arched downward to form a plurality of bending portions, the plurality of the fastening portions and the plurality of the bending portions being mounted to the outer surface of the flexible printed circuit board, the plurality of the bending portions being disposed to the attaching surfaces of the plurality of the conductive pieces, the front ends of the plurality of the fastening portions and the plurality of the bending portions being corresponding to and located above the plurality of the conductive pieces, rear ends of the plurality of the fastening portions being corresponding to and located above a rear end of the inner surface of the linking portion;
a plurality of pads disposed to the fastening surfaces of the plurality of the conductive pieces; and
a shell surrounding the insulating housing, the flexible printed circuit board, the terminal assembly and the plurality of the pads.

18. The electrical connector as claimed in claim 17, wherein front ends of the plurality of the bending portions extend frontward to form a plurality of contact portions, and the plurality of the contact portions are exposed out from a front end of the flexible printed circuit board, rear ends of the plurality of the fastening portions are bent upward and then are arched outward to form a plurality of connecting portions, free ends of the plurality of the connecting portions extend frontward and along an extending direction of the plurality of the contact portions to form a plurality of extending portions, free ends of the plurality of the extending portions are connected together to form a strengthening portion, two opposite sides of the strengthening portion are bent outward and then extend downward to form two first location feet.

19. An electrical connector, comprising:
an insulating housing;
two transmission modules mounted in a top and a bottom of the insulating housing, the two transmission modules being opposite to each other along an up-down direction, each transmission module including a terminal assembly, a flexible printed circuit board and a plurality of pads, the flexible printed circuit board having a linking portion, and a plurality of conductive pieces disposed to a front end of an inner surface of the linking portion, surfaces of the plurality of the conductive pieces being plated and being golden yellow, the plurality of the conductive pieces being abreast arranged along a transverse direction, each conductive piece being finger-like, the terminal assembly being adhered to an outer surface of the flexible printed circuit board, the terminal assembly having a plurality of terminals which have a plurality of fastening portions, front ends of the plurality of the fastening portions being arched downward to form a plurality of bending portions, the plurality of the fastening portions and the plurality of the bending portions being mounted to the outer surface of the flexible printed circuit board, the front ends of the plurality of the fastening portions and the plurality of the bending portions being corresponding to and located above the plurality of the conductive pieces, rear ends of the plurality of the fastening portions being corresponding to and located above a rear end of the inner surface of the linking portion, the plurality of the pads being disposed to a front end of an inner surface of the flexible printed circuit board and being corresponding to a front end of the terminal assembly; and
a shell surrounding the insulating housing and the two transmission modules.

\* \* \* \* \*